(12) United States Patent
Sasaki et al.

(10) Patent No.: US 11,048,028 B2
(45) Date of Patent: Jun. 29, 2021

(54) SEMICONDUCTOR CHIP AND ELECTRONIC APPARATUS FOR SUPPRESSING DEGRADATION OF SEMICONDUCTOR CHIP

(71) Applicant: SONY SEMICONDUCTOR SOLUTIONS CORPORATION, Kanagawa (JP)

(72) Inventors: Naoto Sasaki, Kanagawa (JP); Yutaka Ooka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 15 days.

(21) Appl. No.: 15/777,821

(22) PCT Filed: Nov. 21, 2016

(86) PCT No.: PCT/JP2016/084382
§ 371 (c)(1),
(2) Date: May 21, 2018

(87) PCT Pub. No.: WO2017/094537
PCT Pub. Date: Jun. 8, 2017

(65) Prior Publication Data
US 2018/0348415 A1 Dec. 6, 2018

(30) Foreign Application Priority Data

Dec. 3, 2015 (JP) .............................. JP2015-236450

(51) Int. Cl.
*G02B 5/26* (2006.01)
*H01L 27/14* (2006.01)
(Continued)

(52) U.S. Cl.
CPC ................ *G02B 5/26* (2013.01); *H01L 27/14* (2013.01); *H01L 27/14618* (2013.01);
(Continued)

(58) Field of Classification Search
CPC ................ G02B 5/26; H01L 27/14618; H01L 27/14625; H01L 27/14; H01L 27/14621; H04N 5/374
(Continued)

(56) References Cited

U.S. PATENT DOCUMENTS 9,835,779 B2 * 12/2017 Tatemura ............... G02B 5/283
2003/0210334 A1 * 11/2003 Sarwari .................. H04N 5/335
348/222.1
(Continued)

FOREIGN PATENT DOCUMENTS

CN 103907179 A 7/2014
CN 104246997 A 12/2014
(Continued)

OTHER PUBLICATIONS

International Search Report and Written Opinion of PCT Application No. PCT/JP2016/084382, dated Feb. 14, 2017, 11 pages.

*Primary Examiner* — Lin Ye
*Assistant Examiner* — Chan T Nguyen
(74) *Attorney, Agent, or Firm* — Chip Law Group

(57) ABSTRACT

Provided is a semiconductor chip and an electronic apparatus that can suppress degradation of optical characteristics of a semiconductor chip including an image pickup device. The semiconductor chip includes an image pickup device, a transparent protective member that protects the image pickup device, an IR cut film arranged between a light-receiving surface of the image pickup device and the protective member, a bonding layer that bonds the IR cut film and the protective member together, and a protective film
(Continued)

that covers side surfaces of the IR cut film and the bonding layer.

13 Claims, 18 Drawing Sheets

(51) Int. Cl.
*H01L 27/146* (2006.01)
*H04N 5/374* (2011.01)

(52) U.S. Cl.
CPC .. *H01L 27/14621* (2013.01); *H01L 27/14623* (2013.01); *H01L 27/14625* (2013.01); *H01L 27/14627* (2013.01); *H01L 27/14692* (2013.01); *H04N 5/374* (2013.01)

(58) Field of Classification Search
USPC .......................................................... 348/294
See application file for complete search history.

(56) References Cited

U.S. PATENT DOCUMENTS

| | | | |
|---|---|---|---|
| 2005/0077458 A1* | 4/2005 | Ma | H01L 24/05 250/239 |
| 2006/0118795 A1 | 6/2006 | Araki | |
| 2011/0074020 A1* | 3/2011 | Yamakami | H01L 24/16 257/737 |
| 2014/0252607 A1 | 9/2014 | Miyauchi et al. | |
| 2015/0116970 A1 | 4/2015 | Kishi et al. | |
| 2015/0259547 A1 | 9/2015 | Ezoe et al. | |
| 2015/0260886 A1* | 9/2015 | Higuchi | G02B 5/22 257/432 |
| 2015/0350583 A1* | 12/2015 | Mauritzson | H01L 27/14621 250/208.1 |

FOREIGN PATENT DOCUMENTS

| | | | |
|---|---|---|---|
| CN | 104823083 A | | 8/2015 |
| CN | 105793988 A | | 7/2016 |
| EP | 2849216 A1 | | 3/2015 |
| EP | 2927717 A1 | | 10/2015 |
| EP | 3100303 A2 | | 12/2016 |
| JP | 2000-036657 A | | 2/2000 |
| JP | 2006-046874 A | | 2/2006 |
| JP | 2006-049874 A | | 2/2006 |
| JP | 2013-110403 A | | 6/2013 |
| JP | 2014-130344 | * | 11/2013 |
| JP | 2014-130344 A | | 7/2014 |
| JP | WO2015111419 | * | 7/2015 |
| JP | 2015-159275 A | | 9/2015 |
| JP | 2015-200816 A | | 11/2015 |
| KR | 10-2014-0084095 A | | 7/2014 |
| KR | 10-2015-0023222 A | | 3/2015 |
| KR | 10-2015-0072428 A | | 6/2015 |
| KR | 10-2016-0113605 A | | 9/2016 |
| TW | 201336004 A | | 9/2013 |
| TW | 201401450 A | | 1/2014 |
| TW | 201428067 A | | 7/2014 |
| TW | 201535699 A | | 9/2015 |
| WO | 2013/062095 A1 | | 5/2013 |
| WO | 2013/168352 A1 | | 11/2013 |
| WO | 2014/084289 A1 | | 6/2014 |
| WO | 2015/111419 A2 | | 7/2015 |

* cited by examiner

SEMICONDUCTOR CHIP AND ELECTRONIC APPARATUS FOR SUPPRESSING DEGRADATION OF SEMICONDUCTOR CHIP

CROSS REFERENCE TO RELATED APPLICATIONS

This application is a U.S. National Phase of International Patent Application No. PCT/JP2016/084382 filed on Nov. 21, 2016, which claims priority benefit of Japanese Patent Application No. JP 2015-236450 filed in the Japan Patent Office on Dec. 3, 2015. Each of the above-referenced applications is hereby incorporated herein by reference in its entirety.

TECHNICAL FIELD

The present technology relates to a semiconductor chip and an electronic apparatus, and in particular relates to a semiconductor chip and an electronic apparatus that include an image pickup device.

BACKGROUND ART

Conventionally, in a semiconductor chip including an image pickup device, it has been devised to form a coating type IR cut filter (IRCF) between the image pickup device and a glass substrate that protects the image pickup device (see, for example, Patent Document 1).

CITATION LIST

Patent Document

Patent Document 1: Japanese Patent Application Laid-Open No. 2014-130344

SUMMARY OF THE INVENTION

Problems to be Solved by the Invention

For the coating type IRCF, a metal complex material such as a copper complex is generally used, but this material is easily degraded by oxidation. However, in the invention described in Patent Document 1, it is assumed that outside air enters through an adhesive portion provided in order to bond the image pickup device and the glass substrate together in the periphery of the image pickup device and the IRCF is oxidized. As a result, light-shielding performance of the IRCF is degraded, and optical characteristics of the semiconductor chip are degraded.

In addition, since a glass substrate having a thickness of at least 200 μm is generally used, the thickness is a factor that prevents downsizing of the semiconductor chip.

The present technology has been made in view of such a situation, and is intended to suppress degradation of the optical characteristics of the semiconductor chip including the image pickup device.

In addition, the present technology is intended to downsize the semiconductor chip.

Solutions to Problems

A semiconductor chip of a first aspect of the present technology includes: an image pickup device; a transparent protective member that protects the image pickup device; an IR cut film arranged between a light-receiving surface of the image pickup device and the protective member; a bonding layer that bonds the IR cut film and the protective member together; and a protective film that covers side surfaces of the IR cut film and the bonding layer.

The protective film can be made to further cover at least a portion of a side surface of the image pickup device.

The IR cut film and the bonding layer can each include an adhesive type IR cut film having adhesiveness, and the image pickup device and the protective member can be bonded together via the adhesive type IR cut film.

In the IR cut film, a plurality of IR cut filters having respective different light-shielding wavelength bands can be layered.

Metal solder having a melting point of less than or equal to 150° C. can be provided on a surface to be soldered of the semiconductor chip.

A reflective type IR cut film can be formed on at least one surface of the protective member.

The IR cut film can be a coating type.

An electronic apparatus of a second aspect of the present technology includes: a semiconductor chip including an image pickup device, a transparent protective member that protects the image pickup device, an IR cut film arranged between a light-receiving surface of the image pickup device and the protective member, a bonding layer that bonds the IR cut film and the protective member together, and a protective film that covers side surfaces of the IR cut film and the bonding layer; and a signal processing circuit that processes a signal from the image pickup device.

A semiconductor chip of a third aspect of the present technology includes: an image pickup device; a transparent protective member that protects the image pickup device; and an IR cut film arranged inside the protective member.

The protective member can be provided with: a first member including a planar groove in which the IR cut film is arranged, on a surface on an opposite side of the image pickup device from a light-receiving surface side; and a second member that seals the groove, and a bonding layer that bonds the IR cut film and the second member together can be further provided.

An electronic apparatus of a fourth aspect of the present technology includes: a semiconductor chip including an image pickup device, a transparent protective member that protects the image pickup device, and an IR cut film arranged inside the protective member; and a signal processing circuit that processes a signal from the image pickup device.

A semiconductor chip of a fifth aspect of the present technology includes: an image pickup device, and a transparent resin film that is applied on a light-receiving surface side of the image pickup device and protects the image pickup device.

The thickness of the resin film can be made less than 200 μm.

An IR cut film can be arranged on the resin film.

An antireflection film can be arranged on the IR cut film.

The antireflection film can be made to further surround side surfaces of the resin film and the IR cut film.

A diffraction grating can be formed on a surface of the resin film.

The diffraction grating can be provided with a slit-shaped light-shielding film.

A transparent film can be arranged on an on-chip lens of the image pickup device, the transparent film having a refractive index smaller than a material of the on-chip lens.

An electronic apparatus of a sixth aspect of the present technology includes: a semiconductor chip including an image pickup device and a transparent resin film that is applied on a light-receiving surface side of the image pickup device and protects the image pickup device; and a signal processing circuit that processes a signal from the image pickup device.

In the first or second aspect of the present technology, the IR cut film is surrounded by the image pickup device, the protective member, and the protective film.

In the third or fourth aspect of the present technology, the IR cut film is surrounded by the protective member.

In the fifth or sixth aspect of the present technology, the light-receiving surface of the image pickup device is protected by the protective film.

Effects of the Invention

According to the first to fourth aspects of the present technology, the degradation can be suppressed of the optical characteristics of the semiconductor chip including the image pickup device.

According to the fifth or sixth aspect of the present technology, downsizing can be achieved of the semiconductor chip.

Note that, the effects described in the present specification are merely examples, and the effects of the present technology are not limited to the effects described in the specification, and may have additional effects.

MODE FOR CARRYING OUT THE INVENTION

The following is a description of a mode for carrying out the present technology (the mode will be hereinafter referred to as the embodiment). Note that, the description will be made in the following order.

1. First Embodiment
2. Modifications of First Embodiment
3. Second Embodiment
4. Modifications of Second Embodiment
5. Application Examples 1. First Embodiment {Configuration Example of Semiconductor Chip}

Figure 1:
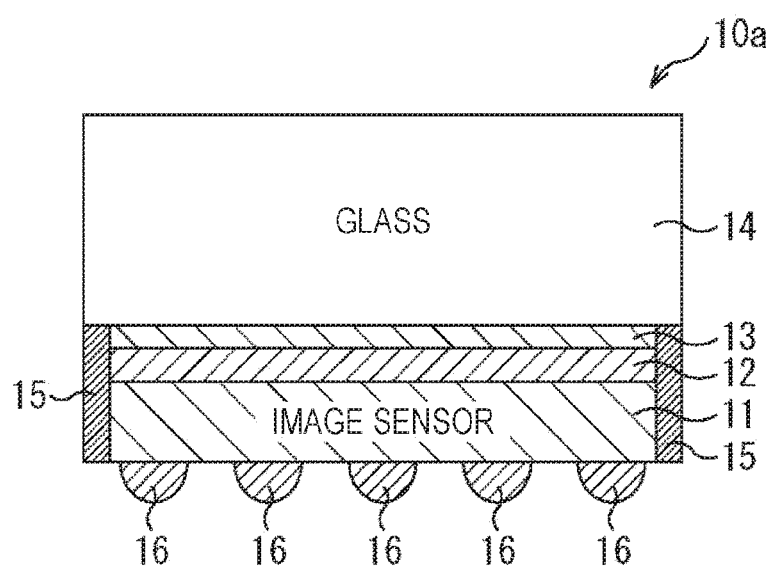
FIG. 1 is a cross-sectional view schematically illustrating a configuration example of a semiconductor chip according to a first embodiment of the present technology.

FIG. 1 is a cross-sectional view schematically illustrating a configuration example of a semiconductor chip 10a according to a first embodiment of the present technology.

Note that, in the following, a side of the semiconductor chip 10a on which light is incident is defined as an upper side of the semiconductor chip 10a, and an opposite side of the semiconductor chip 10a from the side on which the light is incident is defined as a lower side. In addition, in the following, a surface of an image sensor 11 on which the light is incident is referred to as a light-receiving surface, and a surface on an opposite side from the light-receiving surface is referred to as a bottom surface. This also applies to other semiconductor chips as described later.

The semiconductor chip 10a is a semiconductor chip having a Chip Size Package (CSP) structure, and the image sensor 11, an IR cut film 12, a bonding layer 13, and a glass 14 are layered in order from the bottom.

The type of the image sensor 11 is not particularly limited. For example, the image sensor 11 may be a front side illumination type or a back side illumination type. In addition, for example, the image sensor 11 may be a CMOS image sensor, a CCD image sensor, or an image sensor of another type.

The IR cut film 12 includes, for example, a coating type IR cut filter including a metal complex material such as a copper complex. The IR cut film 12 reduces an infrared light component contained in incident light and suppresses incidence of infrared light to the image sensor 11.

The glass 14 is provided to protect the image sensor 11.

The IR cut film 12 and the glass 14 are bonded together via the bonding layer 13. The bonding layer 13 includes, for example, a transparent sealing resin or an adhesive.

Here, areas of the image sensor 11, the IR cut film 12, and the bonding layer 13 are slightly smaller than the glass 14, and side surfaces of the image sensor 11, the IR cut film 12, and the bonding layer 13 are arranged inside from side surfaces of the glass 14. Then, the side surfaces of the image sensor 11, the IR cut film 12, and the bonding layer 13 are covered with a protective film 15, and positions of the side surface of the glass 14 and the outer surface of the protective film 15 substantially coincide with each other. The protective film 15 includes, for example, silicon nitride (SiN), silicon oxynitride film (SiON), or a metal such as aluminum or titanium.

A plurality of solder balls 16 is provided on the bottom surface of the image sensor 11, the bottom surface being a surface on which the semiconductor chip 10a is to be soldered to a substrate or the like. For the solder balls 16, for example, an alloy of lead and tin is used.

{Method of Manufacturing Semiconductor Chip 10a}

Figure 2:
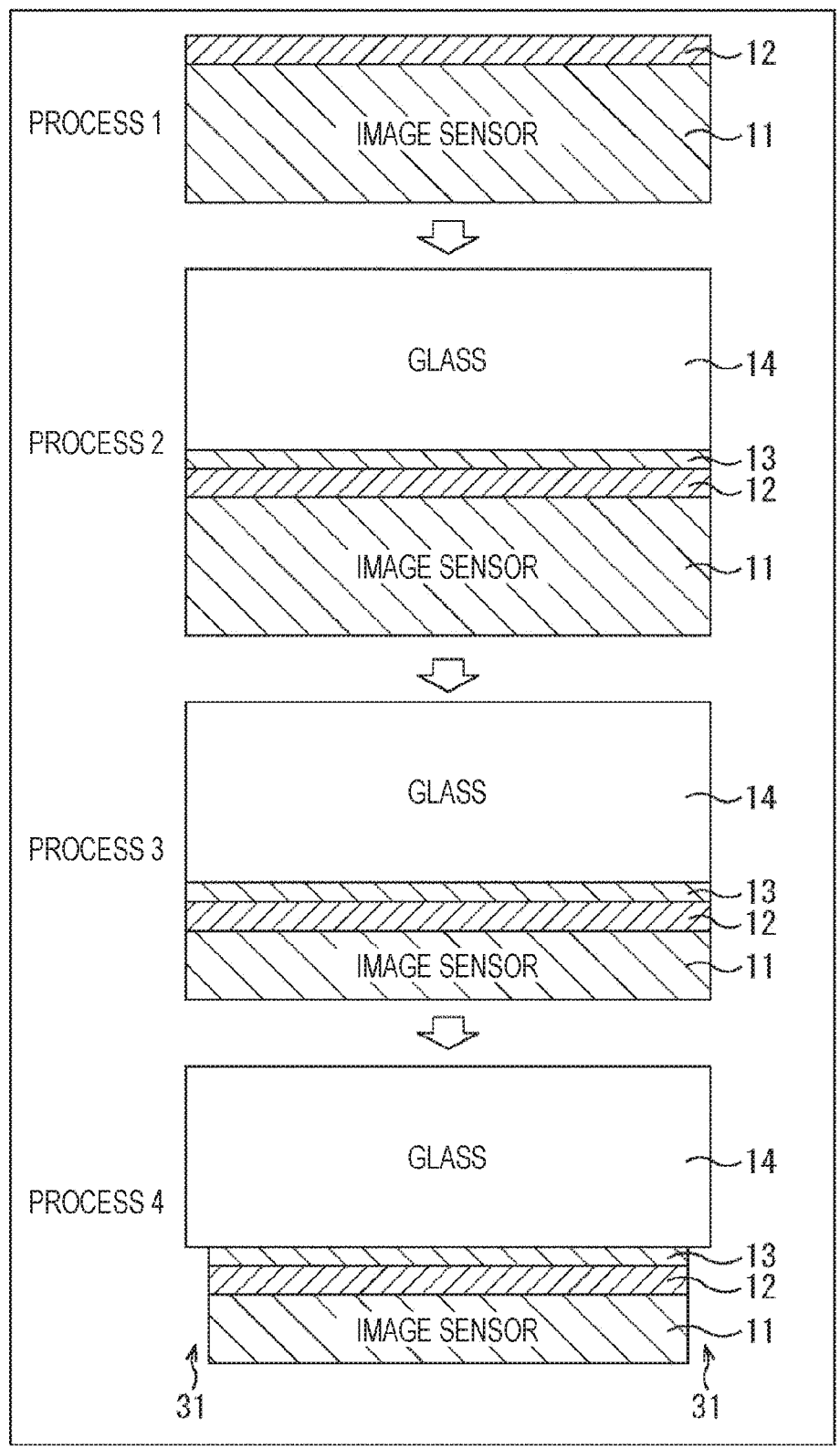
FIG. 2 is a diagram for describing a method of manufacturing the semiconductor chip of FIG. 1.
Figure 3:
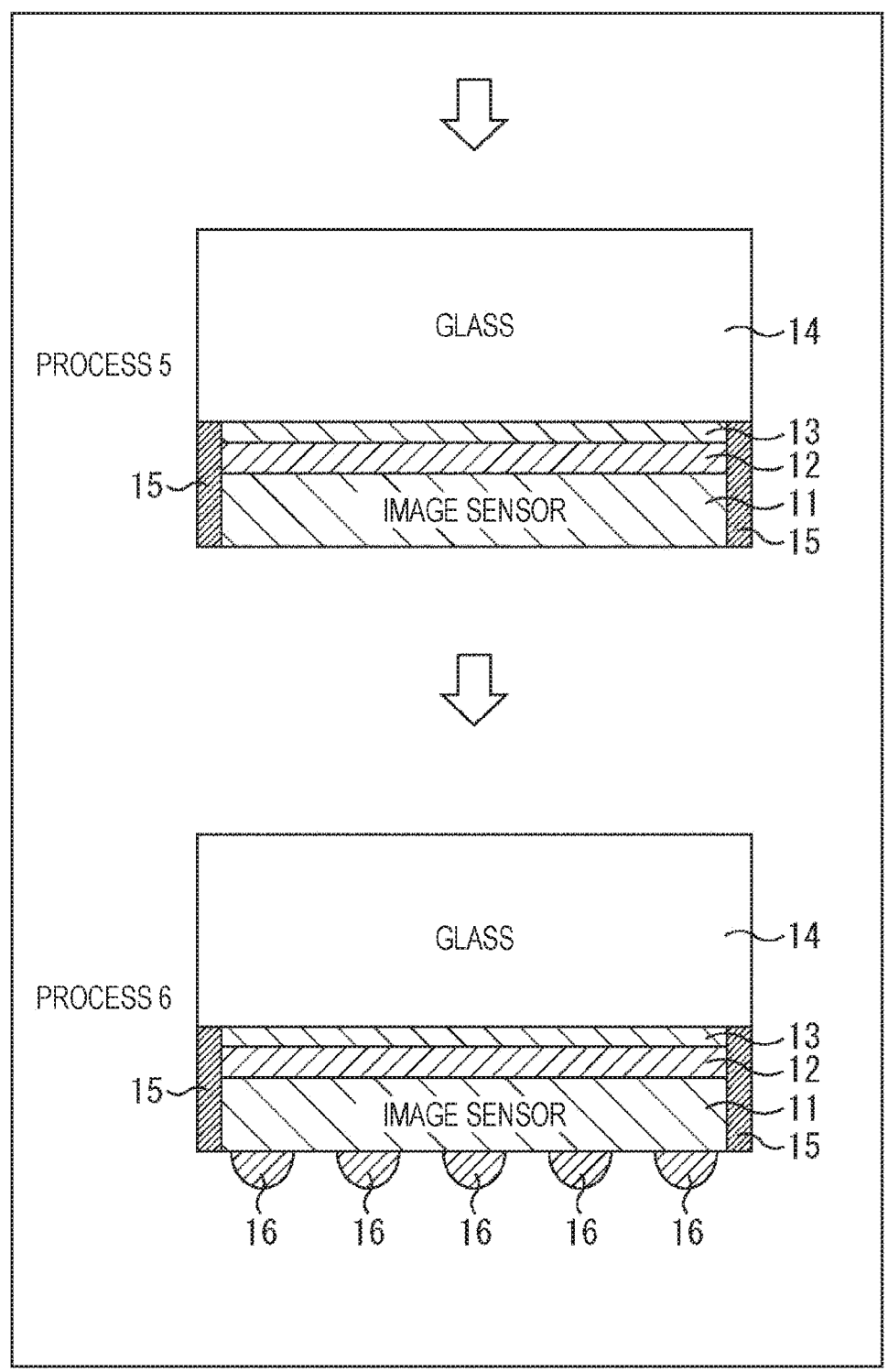
FIG. 3 is a diagram for describing the method of manufacturing the semiconductor chip of FIG. 1.

Next, a method of manufacturing the semiconductor chip 10a will be briefly described with reference to FIGS. 2 and 3.

First, in process 1, the IR cut film 12 is layered on the light-receiving surface side of the image sensor 11. The IR cut film 12 is formed, for example, by using a spin coating method to apply and deposit an IR cut filter on the upper surface of the image sensor 11. Then, the IR cut film 12 is cured by heat of about 150° C.

Here, since the IR cut film 12 is a coating film, control of the particles is possible, and as a result, the yield is improved. In addition, since the IR cut film 12 is not deposited on the glass 14, polishing for scratch removal is possible. Further, since the IR cut film 12 is not deposited on the glass 14, the glass 14 is polished and thinned in the final process, so that it is possible to reduce the height of the semiconductor chip 10a.

In process 2, the IR cut film 12 and the glass 14 are bonded together. For example, the spin coating method is used to apply and deposit a sealing resin on the upper surface of the IR cut film 12, whereby the bonding layer 13 is formed. Next, after the glass 14 is pasted to the upper surface of the bonding layer 13, the bonding layer 13 is cured, and the IR cut film 12 and the glass 14 are bonded together.

In process 3, a silicon substrate (not illustrated) of the image sensor 11 is thinned, and further a redistribution layer (RDL) (not illustrated) is formed.

In process 4, a groove 31 is formed for forming the protective film 15. For example, the groove 31 is formed on the outer periphery of the image sensor 11, the IR cut film 12, and the bonding layer 13, along a scribe line of the image sensor 11, by using a dry etching method. Note that, instead of the dry etching method, the groove 31 may be formed by using a dicer or a laser.

In process 5, the protective film 15 is formed. For example, plasma nitride (P-SiN) is used to deposit a nitride film in the groove 31, whereby the protective film 15 is formed. The surface of the protective film 15 formed is planarized by etch back.

In process 6, the solder balls 16 are formed on the bottom surface of the image sensor 11, and the manufacturing process of the semiconductor chip 10a is completed.

As described above, in the semiconductor chip 10a, the IR cut film 12 is arranged in a region surrounded by the image sensor 11, the glass 14, and the protective film 15. Therefore, entering of outside air into the periphery of the IR cut film 12 is prevented, and it is prevented that the IR cut film 12 is oxidized and the optical characteristics of the semiconductor chip 10a are degraded.

Note that, the protective film 15 does not necessarily cover the entire side surface of the image sensor 11 but may cover only the upper portion of the side surface of the image sensor 11, for example.

2. Modifications of First Embodiment

First Modification

Figure 4:
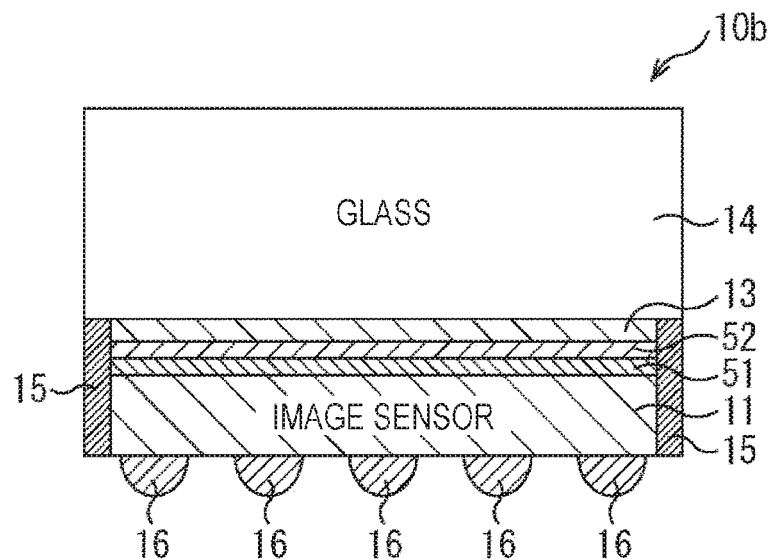
FIG. 4 is a cross-sectional view schematically illustrating a first modification of the semiconductor chip of FIG. 1.

FIG. 4 is a cross-sectional view schematically illustrating a configuration example of a semiconductor chip 10b that is a first modification of the semiconductor chip according to the first embodiment.

The semiconductor chip 10b differs from the semiconductor chip 10a of FIG. 1 in that the IR cut film 12 portion has a two-layer structure of a short IR cut film 51 and a long IR cut film 52.

The short IR cut film 51 and the long IR cut film 52 have respective different infrared light-shielding wavelength bands (light-shielding bands). The light-shielding band of the short IR cut film 51 covers a band in which the wavelength is shorter than that of the long IR cut film 52, and the light-shielding band of the long IR cut film 52 covers a band in which the wavelength is longer than that of the short IR cut film 51. Note that, the light-shielding band of the short IR cut film 51 and the light-shielding band of the long IR cut film 52 may partially overlap each other.

As described above, the IR cut films having respective different light-shielding bands are layered, and the light-shielding wavelength band is divided, whereby light-shielding performance is improved.

Note that, for example, at least three IR cut films may be layered, and the light-shielding band may be further divided.

Second Modification

Figure 5:
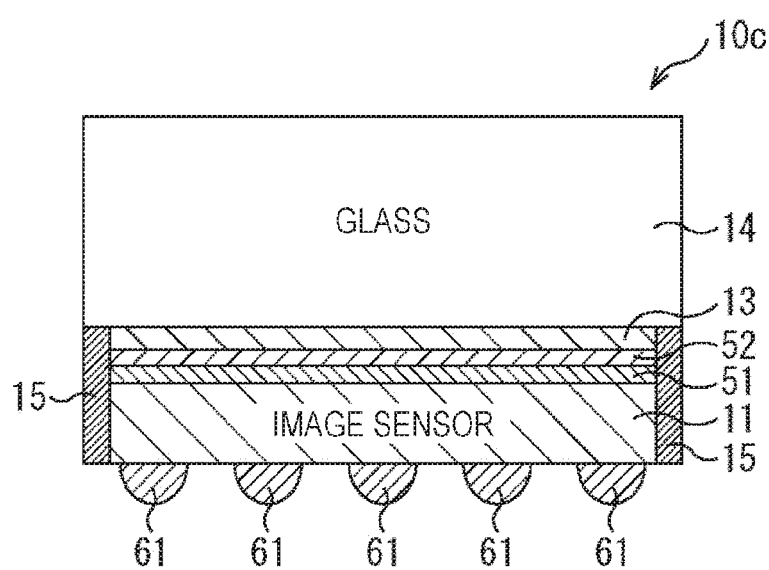
FIG. 5 is a cross-sectional view schematically illustrating a second modification of the semiconductor chip of FIG. 1.

FIG. 5 is a cross-sectional view schematically illustrating a configuration example of a semiconductor chip 10c that is a second modification of the semiconductor chip according to the first embodiment.

The semiconductor chip 10c differs from the semiconductor chip 10b of FIG. 4 in that solder balls 61 are formed instead of the solder balls 16.

For the solder balls 61, for example, metal solder is used having a low melting point (for example, less than or equal to 150° C.) such as SnBi, SnBiAg, SnIn, or In.

The short IR cut film 51 and the long IR cut film 52 are generally weak against heat, and may not withstand the heat in a reflow process. On the other hand, by using the solder balls 61, it is possible to lower the temperature of the reflow process as compared with a case where the general solder balls 16 is used including an alloy of lead and tin. As a result, in the reflow process, the short IR cut film 51 and the long IR cut film 52 are prevented from being damaged.

Third Modification

Figure 6:
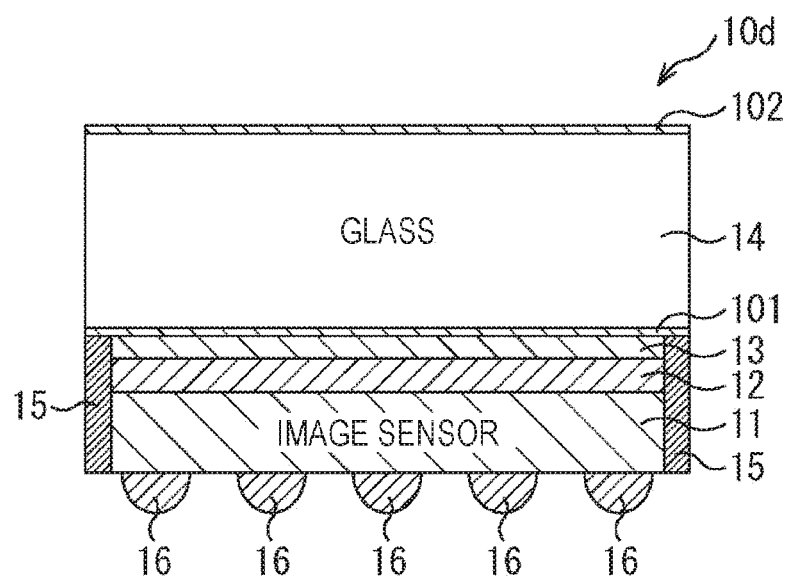
FIG. 6 is a cross-sectional view schematically illustrating a third modification of the semiconductor chip of FIG. 1.

FIG. 6 is a cross-sectional view schematically illustrating a configuration example of a semiconductor chip 10d that is a third modification of the semiconductor chip according to the first embodiment.

The semiconductor chip 10d differs from the semiconductor chip 10a of FIG. 4 in that reflective type IR cut films 101 and 102 are formed respectively on the upper surface and the lower surface of the glass 14.

The reflective type IR cut films 101 and 102 each include, for example, a reflective type IR cut filter in which inorganic films are layered. The reflective type IR cut films 101 and 102 are provided, for example, in a case where desired optical characteristics cannot be satisfied by the IR cut film 12 alone.

Note that, for example, only one of the reflective type IR cut films 101 and 102 may be provided.

Fourth Modification

Figure 7:
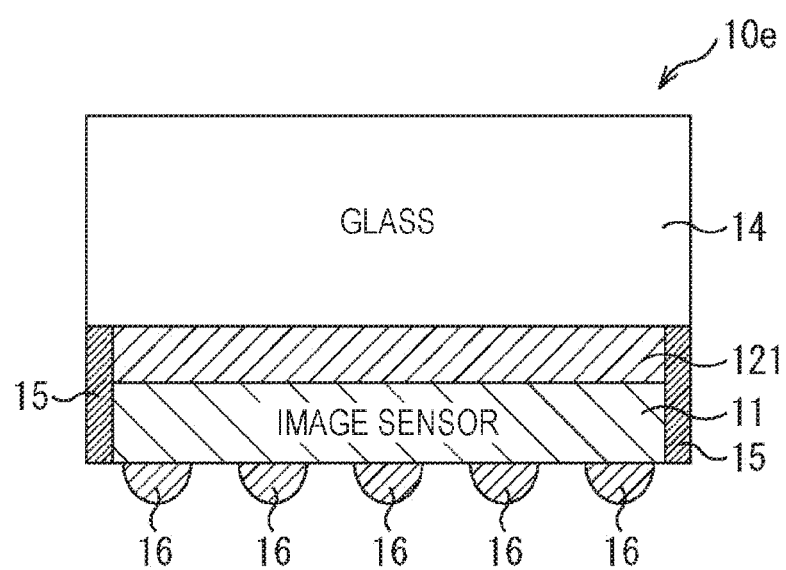
FIG. 7 is a cross-sectional view schematically illustrating a fourth modification of the semiconductor chip of FIG. 1.

FIG. 7 is a cross-sectional view schematically illustrating a configuration example of a semiconductor chip 10e that is a fourth modification of the semiconductor chip according to the first embodiment.

The semiconductor chip 10e differs from the semiconductor chip 10a of FIG. 1 in that an adhesive type IR cut film 121 is formed instead of the IR cut film 12 and the bonding layer 13.

The adhesive type IR cut film 121 includes, for example, an IR cut filter having adhesiveness, and shields infrared light and also has a function of bonding the image sensor 11 and the glass 14 together. For the adhesive type IR cut film 121, for example, a material is used in which metal complex materials are mixed, such as a copper complex used for an IR cut filter and a material used for a sealing resin.

As described above, instead of the two-layer structure of the IR cut film 12 and the bonding layer 13, a single layer structure of the adhesive type IR cut film 121 is formed, whereby the semiconductor chip 10e can be thinned.

Fifth Modification

Figure 8:
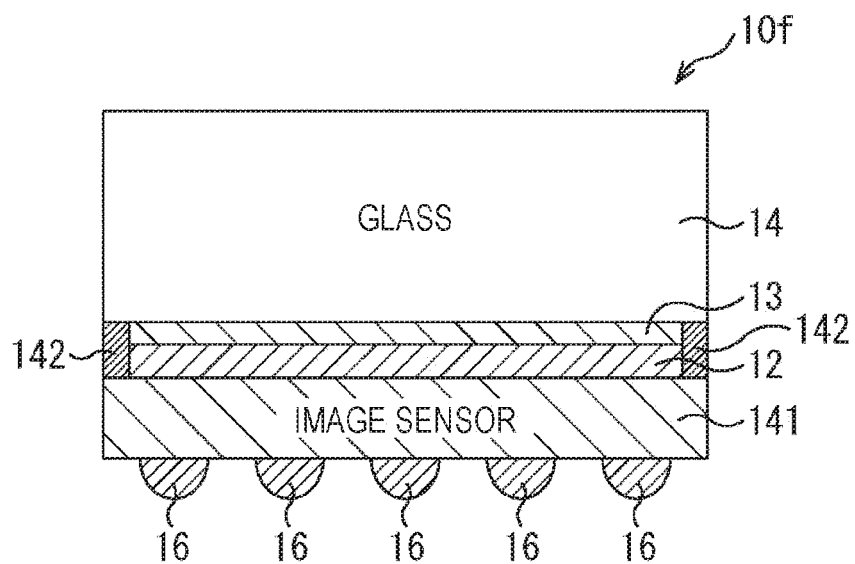
FIG. 8 is a cross-sectional view schematically illustrating a fifth modification of the semiconductor chip of FIG. 1.

FIG. 8 is a cross-sectional view schematically illustrating a configuration example of a semiconductor chip 10f that is a fifth modification of the semiconductor chip according to the first embodiment.

The semiconductor chip 10f differs from the semiconductor chip 10a of FIG. 1 in that an image sensor 141 and a protective film 142 are provided instead of the image sensor 11 and the protective film 15.

The image sensor 141 has an area different from that of the image sensor 11 of the semiconductor chip 10a. Specifically, the area of the image sensor 141 substantially coincides with the area of the glass 14.

The protective film 142 has a rib structure. Specifically, the protective film 142 is formed, on the light-receiving surface of the image sensor 141, to cover the side surfaces of the IR cut film 12 and the bonding layer 13, along the outer periphery of the image sensor 141.

As described above, in the semiconductor chip 10f, the IR cut film 12 is arranged in a region surrounded by the image sensor 11, the glass 14, and the protective film 142. Therefore, it is prevented that the IR cut film 12 is oxidized due to entering of outside air into the periphery of the IR cut film 12 and the optical characteristics of the semiconductor chip 10f are degraded.

Sixth Modification

Figure 9:
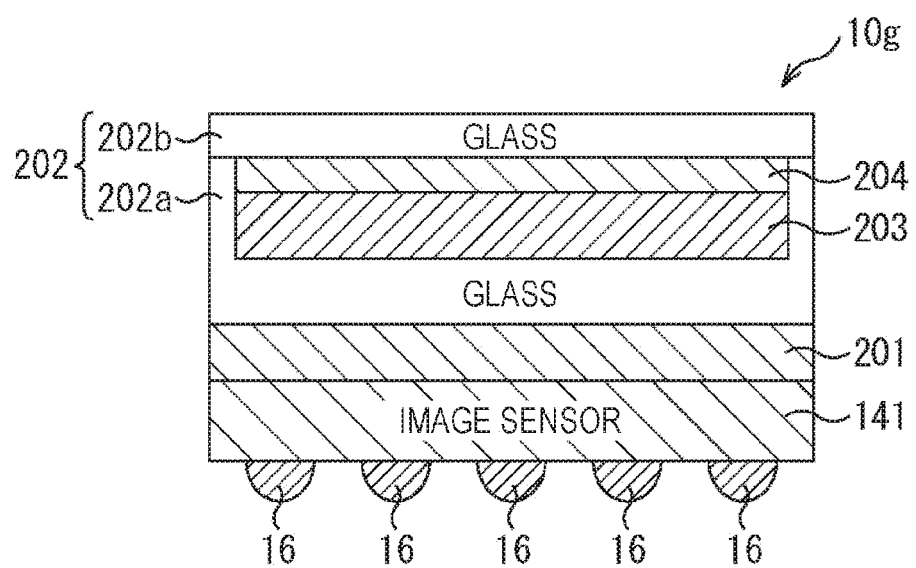
FIG. 9 is a cross-sectional view schematically illustrating a sixth modification of the semiconductor chip of FIG. 1.

FIG. 9 is a cross-sectional view schematically illustrating a configuration example of a semiconductor chip 10g that is a sixth modification of the semiconductor chip according to the first embodiment.

The semiconductor chip 10g differs from the semiconductor chip 10f of FIG. 8 in that instead of the IR cut film 12, the bonding layer 13, the glass 14, and the protective film 142, a bonding layer 201, a protective member 202, an IR cut film 203, and a bonding layer 204 are provided. The protective member 202 includes a glass 202a and a glass 202b that are transparent.

The image sensor 141 and the glass 202a are bonded together via the bonding layer 201. For the bonding layer 201, for example, a material is used similar to that of the bonding layer 13 of FIG. 1.

On the upper surface as an opposite side of the glass 202a from the light-receiving surface side of the image sensor 141, a planar groove is formed surrounded by the side surface of the glass 202a. Then, the IR cut film 203 and the bonding layer 204 are layered in the groove. For the IR cut film 203, for example, a material is used similar to that of the IR cut film 12 of FIG. 1. In addition, the IR cut film 203 is formed in the groove by, for example, application or coating. For the bonding layer 204, for example, a material is used similar to that of the bonding layer 201.

Then, the groove of the glass 202a is sealed by the glass 202b. In addition, the IR cut film 203 and the glass 202b are bonded together by the bonding layer 204, and the position of the glass 202b is fixed.

As described above, in the semiconductor chip 10g, the IR cut film 203 is arranged in the protective member 202 including the glass 202a and the glass 202b. Therefore, it is prevented that the IR cut film 12 is oxidized due to entering of outside air into the periphery of the IR cut film 203 and the optical characteristics of the semiconductor chip 10f are degraded.

Other Modifications

The embodiment and the modifications described above can be combined within a possible range.

For example, in the semiconductor chip 10a, the semiconductor chip 10d, the semiconductor chip 10e, the semiconductor chip 10f, and the semiconductor chip 10g, the solder balls 61 may be used instead of the solder balls 16.

In addition, for example, in the semiconductor chip 10d, the semiconductor chip 10f, and the semiconductor chip 10g, a two-layer structure of a short IR cut film and a long IR cut film may be formed.

Further, instead of the glass 14, the glass 202a, and the glass 202b, a protective member may be used including a transparent material other than glass. For example, a material may be used, such as a transparent resin, or a heat-resistant transparent plastic.

3. Second Embodiment

{Configuration Example of Semiconductor Chip}

Figure 10:
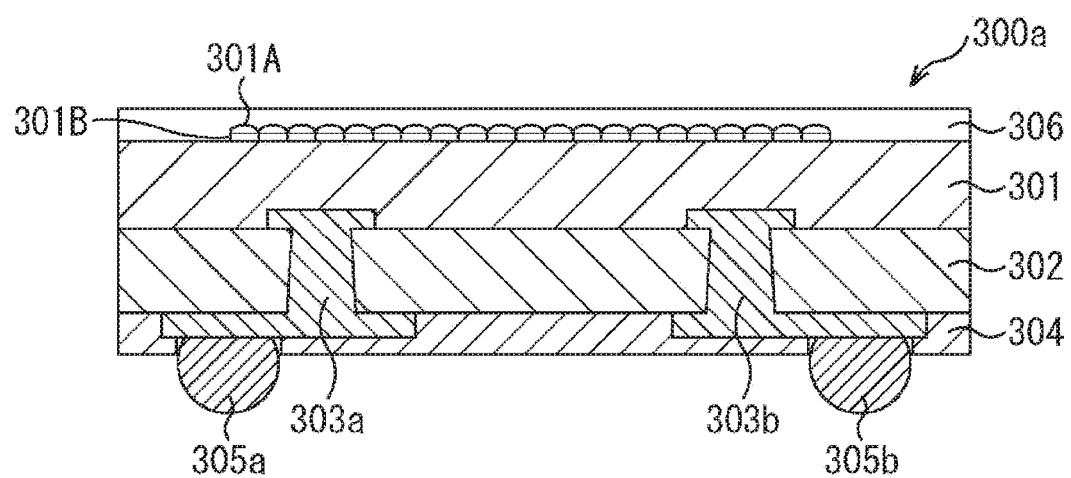
FIG. 10 is a cross-sectional view schematically illustrating a configuration example of a semiconductor chip according to a second embodiment of the present technology.

FIG. 10 is a cross-sectional view schematically illustrating a configuration example of a semiconductor chip 300a according to a second embodiment of the present technology.

In the semiconductor chip 300a, a transparent resin film 306 is layered on the light-receiving surface side where an on-chip lens 301A and a color filter 301B of an image sensor 301 are formed, and a semiconductor substrate 302 is layered on the bottom surface side. In addition, redistribution layers (RDL) 304a and 304b are formed to penetrate the semiconductor substrate 302. A portion of each of the lower surfaces of the RDL 304a and the RDL 304b is covered with solder resist 304, and solder balls 305a and 305b are formed in a portion not covered with the solder resist 304. Then, the image sensor 301 is electrically connected to an external substrate or the like via the solder balls 305a and 305b, and the RDL 304a and the RDL 304b.

Similarly to the image sensor 11 of the semiconductor chip 10a of FIG. 1, the type of the image sensor 301 is not particularly limited. For the on-chip lens 301A, for example, an inorganic film is used such as a SiN film.

For the solder resist 304, for example, a resin material is used.

For the solder balls 305a and 305b, for example, a material is used similar to that of the solder balls 16 of the semiconductor chip 10a of FIG. 1 or the solder balls 61 of the semiconductor chip 10c of FIG. 5.

For the transparent resin film 306, for example, a transparent acrylic resin is used, and the transparent resin film 306 is provided to protect the image sensor 11.

{Method of Manufacturing Semiconductor Chip 300a}

Figure 11:
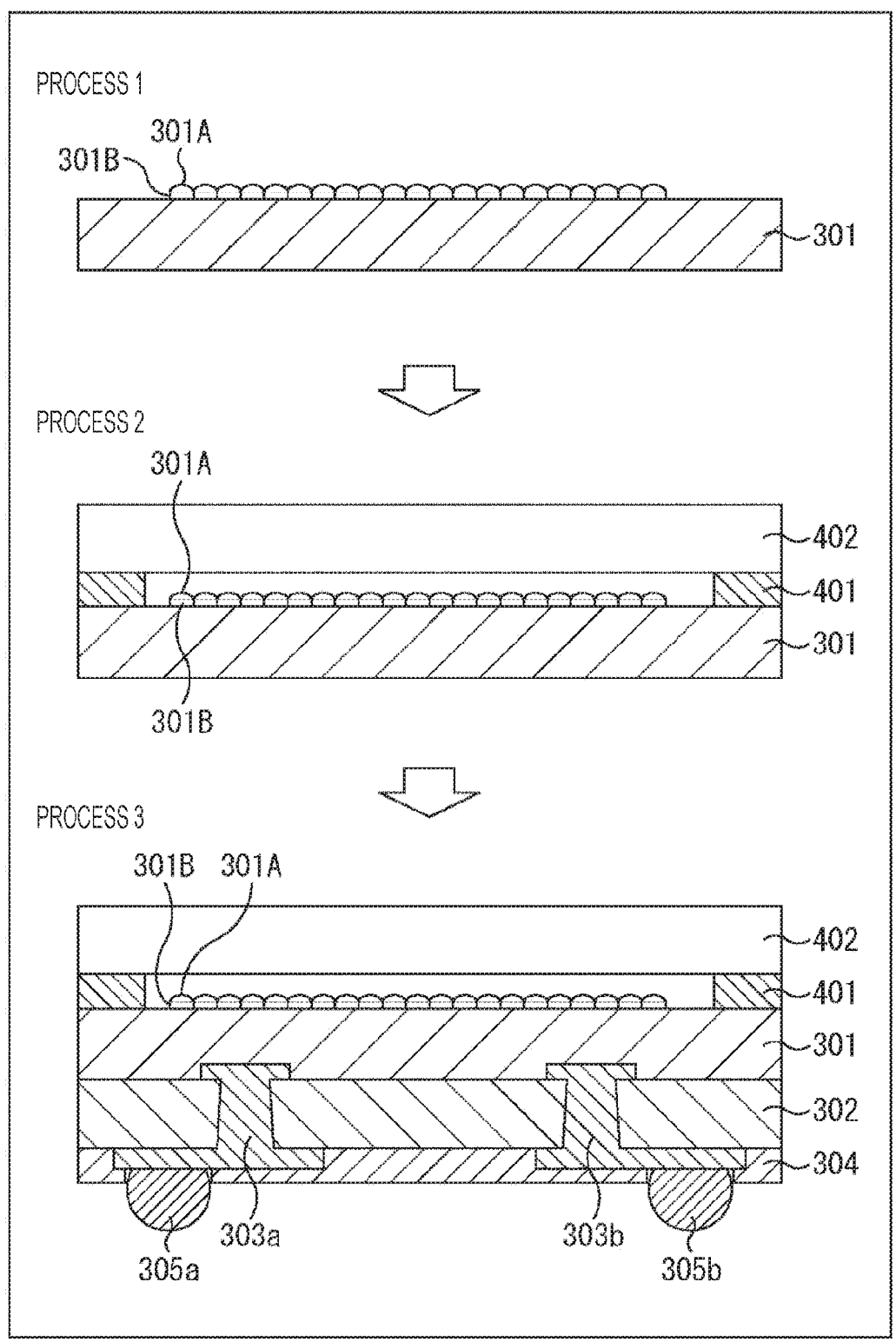
FIG. 11 is a diagram for describing a method of manufacturing the semiconductor chip of FIG. 10.

Next, a method of manufacturing the semiconductor chip 300a will be described with reference to FIGS. 11 to 13. Note that, FIGS. 11 to 13 each illustrate only one semiconductor chip 300a portion in a wafer on which a plurality of the semiconductor chips 300a is arranged.

First, in process 1, the image sensor 301 is manufactured.

In process 2, along the outer periphery of the light-receiving surface of the image sensor 301, a temporary bonding resin 401 is formed to surround the periphery of a portion where the on-chip lens 301A and the color filter 301B are formed. Then, a glass substrate 402 is bonded to the light-receiving surface of the image sensor 301 via the temporary bonding resin 401. The light-receiving surface of the image sensor 301 is protected by the glass substrate 402.

In process 3, the semiconductor substrate 302 is bonded to the bottom surface of the image sensor 301. Next, a through hole is formed in the semiconductor substrate 302, and the RDLs 303a and 303b are formed via the through hole. Next, the solder resist 304 is formed to cover the lower surfaces of the RDLs 303a and 303b except for portions where the solder balls 305a and 305b are formed. Next, the solder balls 305a and 305b are formed in portions not covered with the solder resist 304 of the RDLs 303a and 303b.

In process 4, a laminate tape 353 is pasted to surfaces of the solder resist 304 and the solder balls 305a and 305b. The thickness of the laminate tape 353 is set to, for example, about 400 µm to 500 µm. Due to the laminate tape 403, the lower surface of the wafer is planarized and the thickness of the wafer is increased.

In process 5, the temporary bonding resin 401 and the glass substrate 402 are peeled off. Here, since the thickness and the strength of the wafer are ensured by the laminate tape 403, even if the temporary bonding resin 401 and the glass substrate 402 are peeled off, occurrence is prevented of distortion or deflection of the wafer.

In process 6, the transparent resin film 306 is formed on the light-receiving surface of the image sensor 301. For example, the spin coating method is used to apply and deposit an acrylic resin on the light-receiving surface of the image sensor 301, whereby the transparent resin film 306 is formed. The thickness of the transparent resin film 306 is set to, for example, less than 200 µm, more desirably less than or equal to 150 µm. More specifically, the thickness of the transparent resin film 306 is set to, for example, in the range of about 50 µm to 150 µm.

In process 7, after the laminate tape 403 is peeled off, the wafer is divided into individual pieces, whereby the semiconductor chip 300a is completed. Note that, depending on the shipping form and the like, the laminate tape 403 may be peeled off after the wafer is divided into individual pieces.

Note that, for example, the above processes may be performed by one manufacturer, or may be performed by a plurality of manufacturers in a shared manner. For example, the processes up to process 6, and process 7 may be performed by different manufacturers, respectively.

As described above, by using the coating type transparent resin film 306 for protecting the image sensor 301, the semiconductor chip 300a can be thinned and downsized as compared with a case where glass is used.

In addition, by thinning the transparent resin film 306, it is possible to prevent the transparent resin film 306 from becoming a noise component with respect to an optical signal in a wavelength region other than 400 to 700 nm that is human visibility.

4. Modifications of Second Embodiment

First Modification

Figure 14:
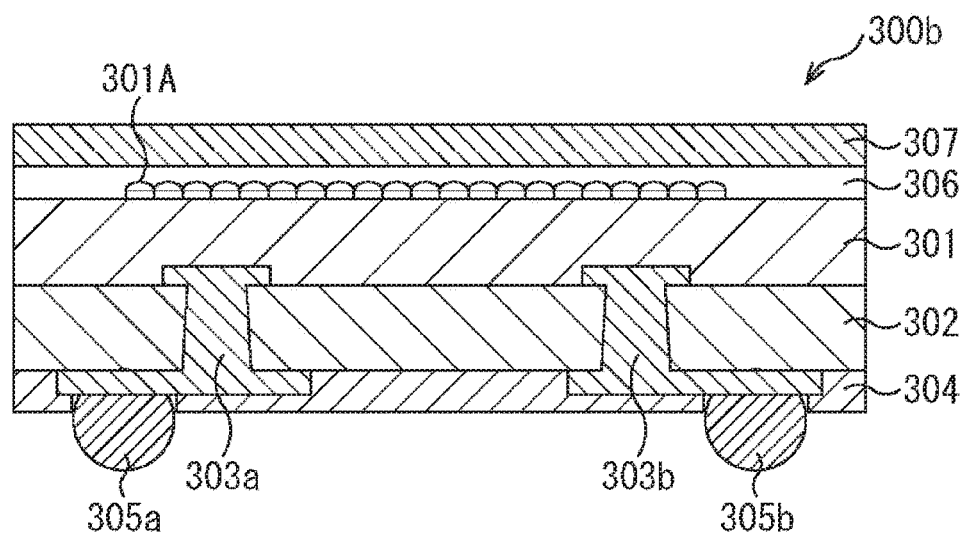
FIG. 14 is a cross-sectional view schematically illustrating a first modification of the semiconductor chip of FIG. 10.

FIG. 14 is a cross-sectional view schematically illustrating a configuration example of a semiconductor chip 300b that is a first modification of the semiconductor chip according to the second embodiment.

The semiconductor chip 300b differs from the semiconductor chip 300a of FIG. 10 in that an IR cut film 307 is layered on the transparent resin film 306.

For the IR cut film 307, for example, a material is used similar to that of the IR cut film 12 of the semiconductor chip 10a of FIG. 1. In addition, the thickness of the IR cut film 307 is set to, for example, less than or equal to 100 µm.

Next, a method of manufacturing the semiconductor chip 300b will be described with reference to FIG. 15.

Figure 13:
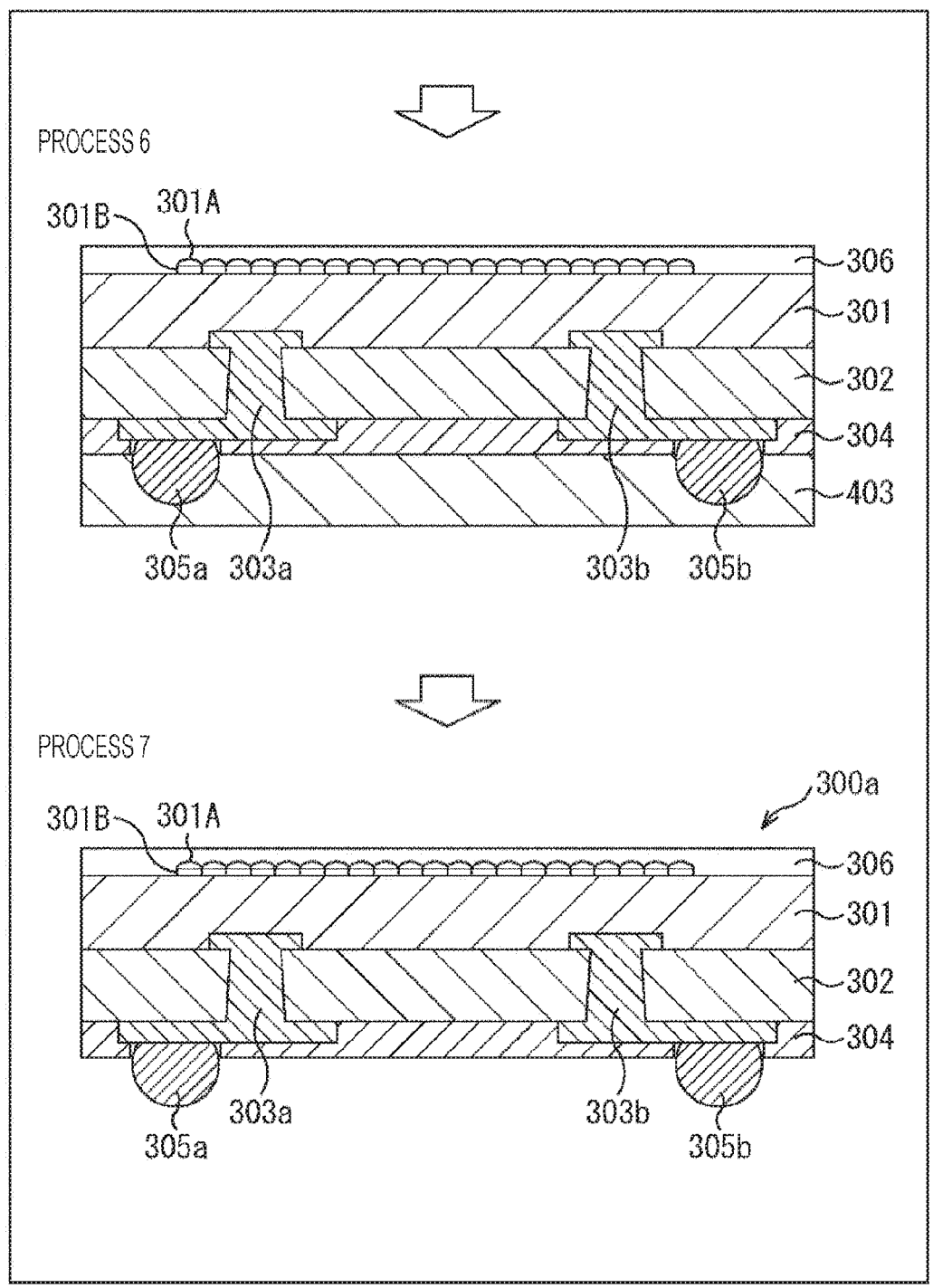
FIG. 13 is a diagram for describing the method of manufacturing the semiconductor chip of FIG. 10.

For example, after the laminate tape 403 is peeled off in process 7 of FIG. 13, in process 8, the spin coating method is used to apply and deposit an IR cut filter on the surface of the transparent resin film 306, whereby the IR cut film 307 is formed. Note that, in consideration of the heat resistance of the on-chip lens 301A, the color filter 301B, and the like, the IR cut film 307 is desirably deposited by a curing process of less than 200° C. Then, the wafer is divided into individual pieces, whereby the semiconductor chip 300b is completed.

Note that, after process 6 of FIG. 13, the IR cut film 307 may be formed before the laminate tape 403 is peeled off.

As described above, the transparent resin film 306 and the IR cut film 307 are continuously formed, whereby the semiconductor chip 300b can be downsized and the optical characteristics can be improved.

Second Modification

Figure 16:
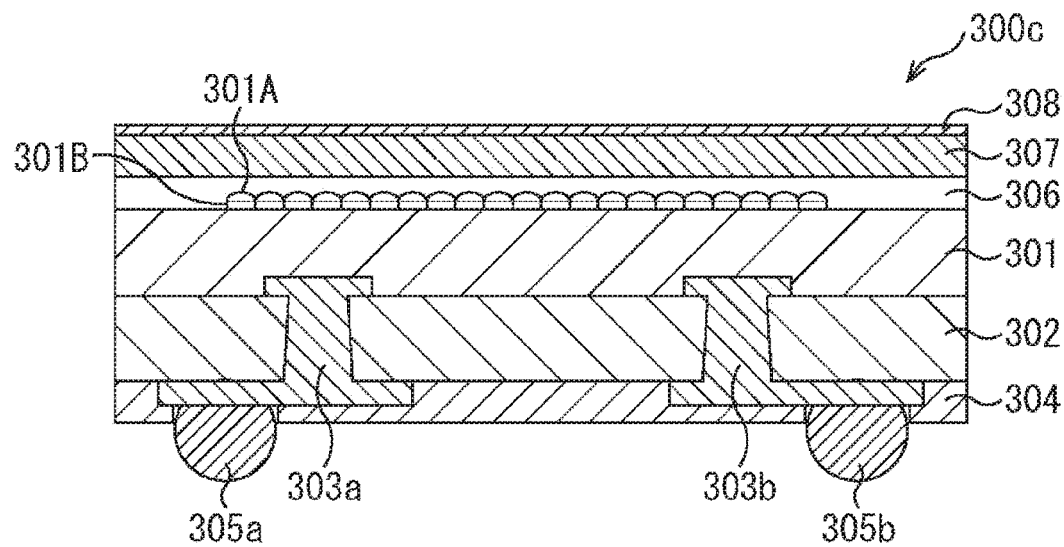
FIG. 16 is a cross-sectional view schematically illustrating a second modification of the semiconductor chip of FIG. 10.

FIG. 16 is a cross-sectional view schematically illustrating a configuration example of a semiconductor chip 300c that is a second modification of the semiconductor chip according to the second embodiment.

The semiconductor chip 300c differs from the semiconductor chip 300b of FIG. 14 in that an antireflection film 308 is layered on the IR cut film 307.

For the antireflection film 308, for example, a SiO2 film, a SiON film, or a nitride film is used. In addition, the thickness of the antireflection film 308 is set to, for example, less than or equal to 0.1 µm.

Figure 15:
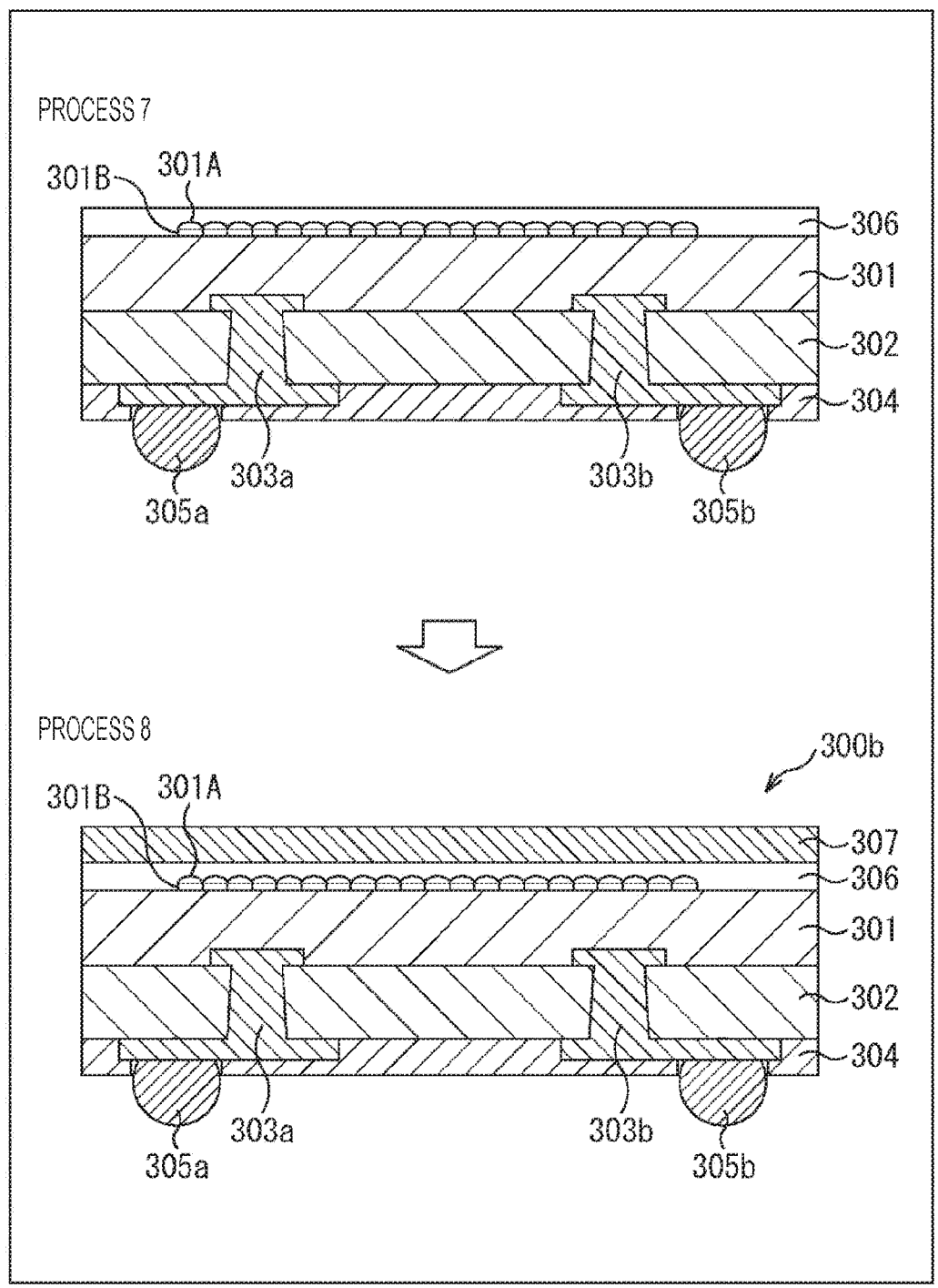
FIG. 15 is a diagram for describing a method of manufacturing the semiconductor chip of FIG. 14.

The antireflection film 308 is deposited, for example, by using a Chemical Vapor Deposition (CVD) method or the spin coating method after the IR cut film 307 is formed in process 8 of FIG. 15 described above.

As described above, in the semiconductor chip 300c, the antireflection film 308 is provided, whereby the optical characteristics can be further improved.

Third Modification

Figure 17:
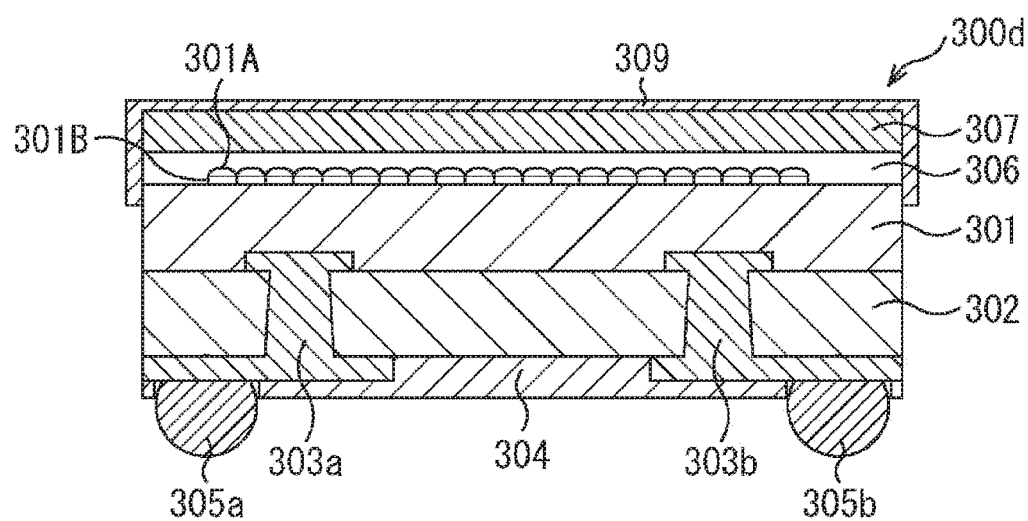
FIG. 17 is a cross-sectional view schematically illustrating a third modification of the semiconductor chip of FIG. 10.

FIG. 17 is a cross-sectional view schematically illustrating a configuration example of a semiconductor chip 300d that is a third modification of the semiconductor chip according to the second embodiment.

The semiconductor chip 300d differs from the semiconductor chip 300c of FIG. 16 in that an antireflection film 309 is formed instead of the antireflection film 308.

The antireflection film 309 covers not only the upper surface of the IR cut film 307 but also all the side surfaces of the transparent resin film 306 and the IR cut film 307, and covers the upper portion of the side surface of the image sensor 301. In addition, the thickness of the antireflection film 309 is set to, for example, less than or equal to 0.1 μm.

The antireflection film 309 also has a function of the protective film, and prevents entering of moisture and outside air to the periphery of the IR cut film 307 and the light-receiving surface of the image sensor 301. As a result, degradation of the image sensor 301 and the IR cut film 307 due to moisture, oxidation, and the like is suppressed, and reliability of the semiconductor chip 300d is improved.

Figure 18:
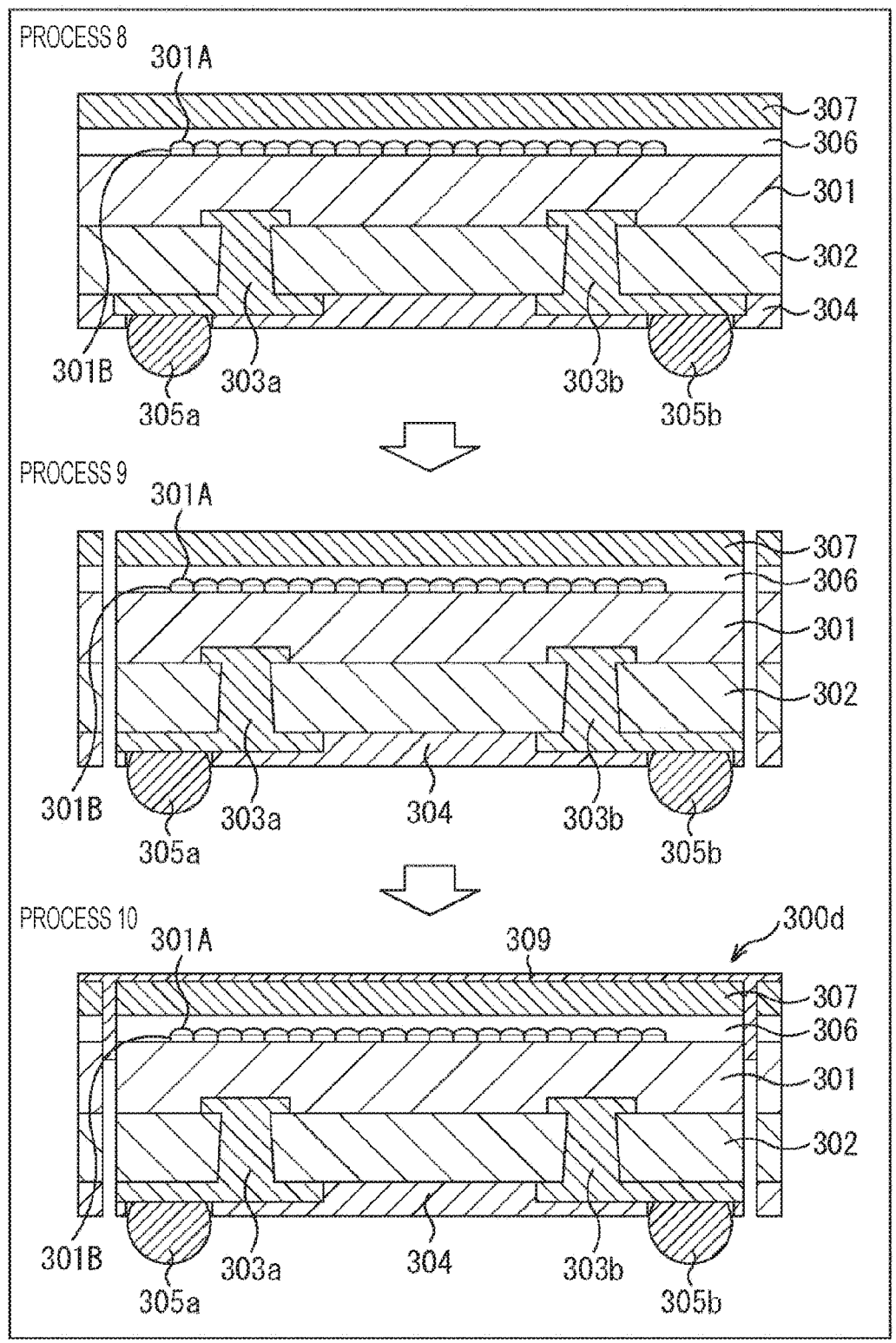
FIG. 18 is a diagram for describing a method of manufacturing the semiconductor chip of FIG. 17.

Next, a method of manufacturing the semiconductor chip 300d will be described with reference to FIG. 18.

For example, after process 8 of FIG. 13, in process 9, the wafer is divided into individual pieces.

In process 10, the antireflection film 309 is formed. The method of forming the antireflection film 309 is not particularly limited.

Fourth Modification

Figure 19:
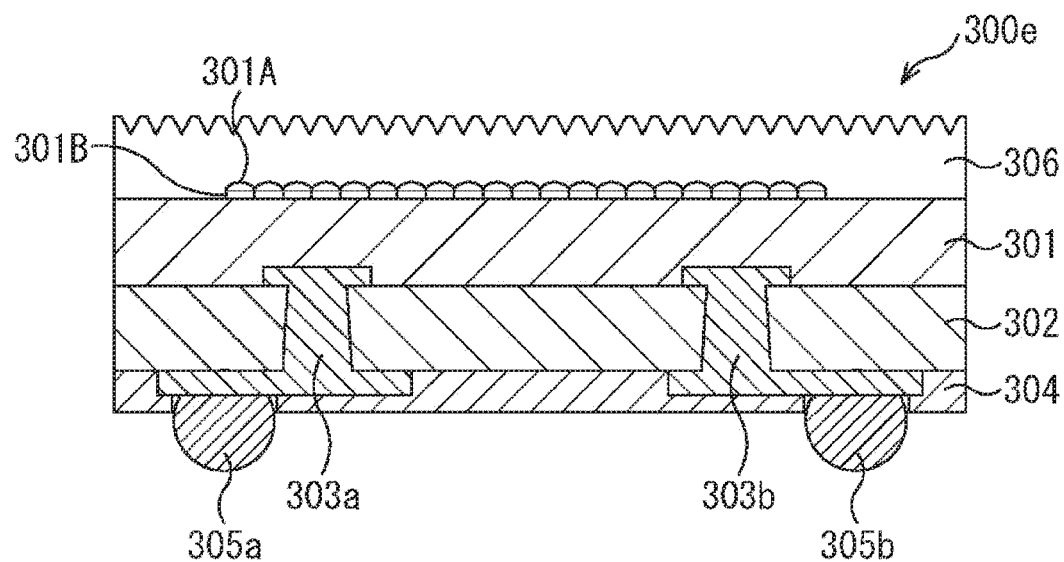
FIG. 19 is a cross-sectional view schematically illustrating a fourth modification of the semiconductor chip of FIG. 10.

FIG. 19 is a cross-sectional view schematically illustrating a configuration example of a semiconductor chip 300e that is a fourth modification of the semiconductor chip according to the second embodiment.

The semiconductor chip 300e differs from the semiconductor chip 300a of FIG. 10 in that a diffraction grating is formed on the upper surface of the transparent resin film 306. Specifically, on the upper surface of the transparent resin film 306, grooves each having an inverted triangle cross section are periodically formed at predetermined intervals, whereby the diffraction grating is formed.

The diffraction grating is formed by an imprinting method, for example, after process 6 or process 7 of FIG. 13.

As a result, the transparent resin film 306 can be made to function as a polarizing filter.

Fifth Modification

Figure 20:
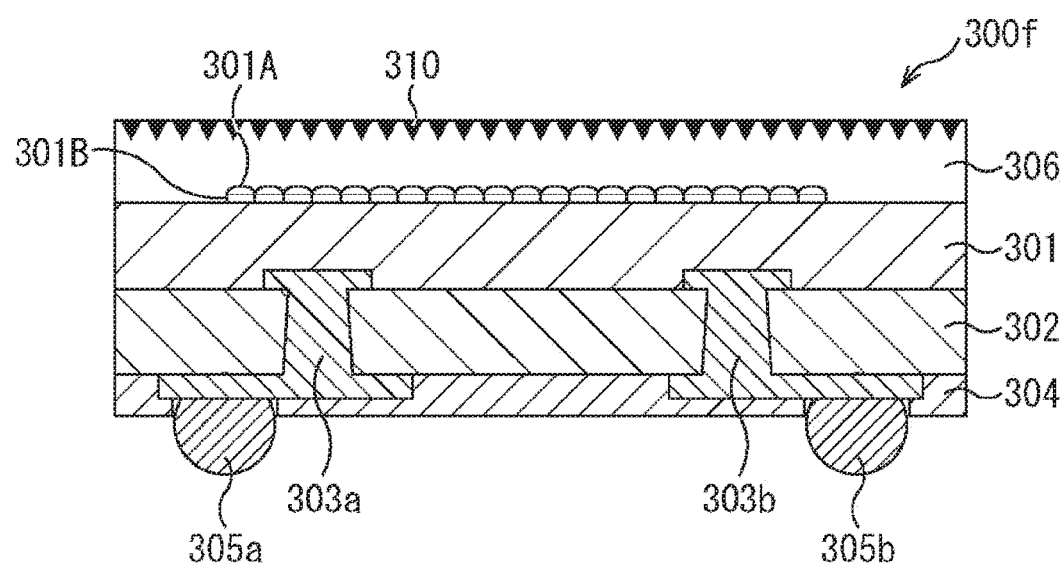
FIG. 20 is a cross-sectional view schematically illustrating a fifth modification of the semiconductor chip of FIG. 10.

FIG. 20 is a cross-sectional view schematically illustrating a configuration example of a semiconductor chip 300f that is a fifth modification of the semiconductor chip according to the second embodiment.

The semiconductor chip 300f differs from the semiconductor chip 300e of FIG. 19 in that a slit-shaped light-shielding film 310 is formed on the upper surface of the transparent resin film 306. The light-shielding film 310 is formed by embedding a metal or the like in the grooves forming the diffraction grating of the transparent resin film 306. In addition, the material of the light-shielding film 310 may be any material as long as it blocks light. For example, for the light-shielding film 310, a metal material such as Al, Ti, Ta, W, or Cu, or a nitride film thereof is used.

Here, an example of a method of manufacturing the light-shielding film 310 will be described.

For example, after the diffraction grating is formed on the upper surface of the transparent resin film 306 illustrated in FIG. 19, the light-shielding film 310 including metal or the like (for example, Al) is formed on the upper surface of the transparent resin film 306, for example, by using a sputtering method. Next, for example, an etch back method is used to etch the entire surface of the light-shielding film 310 until the upper end between the grooves of the transparent resin film 306 is exposed, whereby the slit-shaped light-shielding film 310 is formed.

By the light-shielding film 310, the function of the polarizing filter of the semiconductor chip 300e is enhanced.

Sixth Modification

Figure 21:
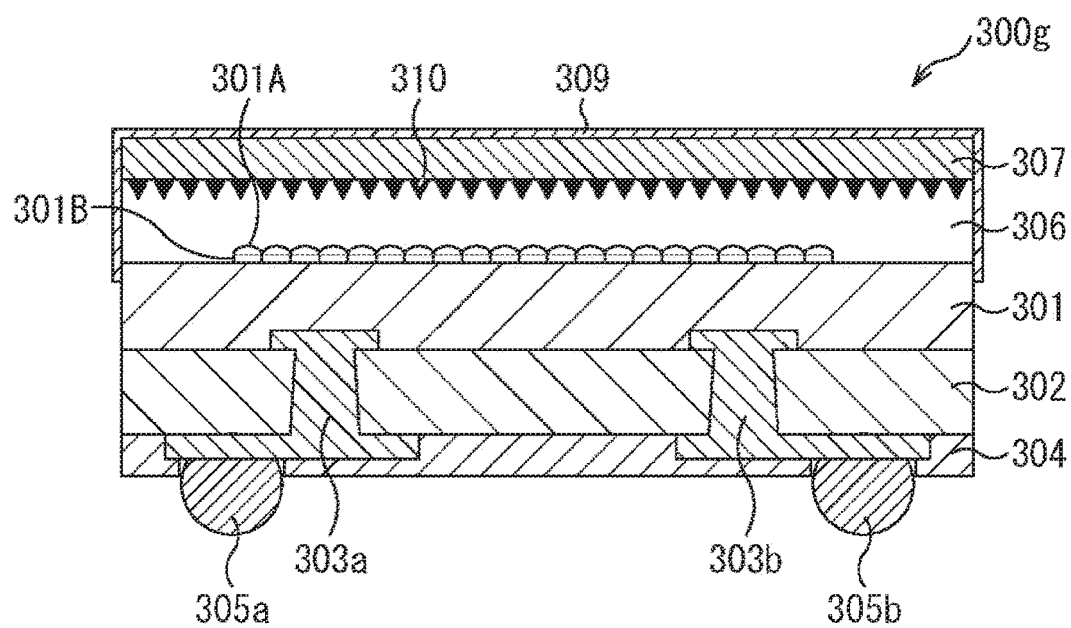
FIG. 21 is a cross-sectional view schematically illustrating a sixth modification of the semiconductor chip of FIG. 10.

FIG. 21 is a cross-sectional view schematically illustrating a configuration example of a semiconductor chip 300g that is a sixth modification of the semiconductor chip according to the second embodiment.

The semiconductor chip 300g differs from the semiconductor chip 300f of FIG. 20 in that the IR cut film 307 and the antireflection film 309 are formed on the transparent resin film 306, similarly to the semiconductor chip 300d of FIG. 17. In other words, the semiconductor chip 300g differs from the semiconductor chip 300d in that the slit-shaped light-shielding film 310 is formed on the upper surface of the transparent resin film 306.

Due to the IR cut film 307 and the antireflection film 309, the optical characteristics and reliability of the semiconductor chip 300f are improved, similarly to the semiconductor chip 300c of FIG. 16 and the semiconductor chip 300d of FIG. 17 described above.

Seventh Modification

Figure 22:
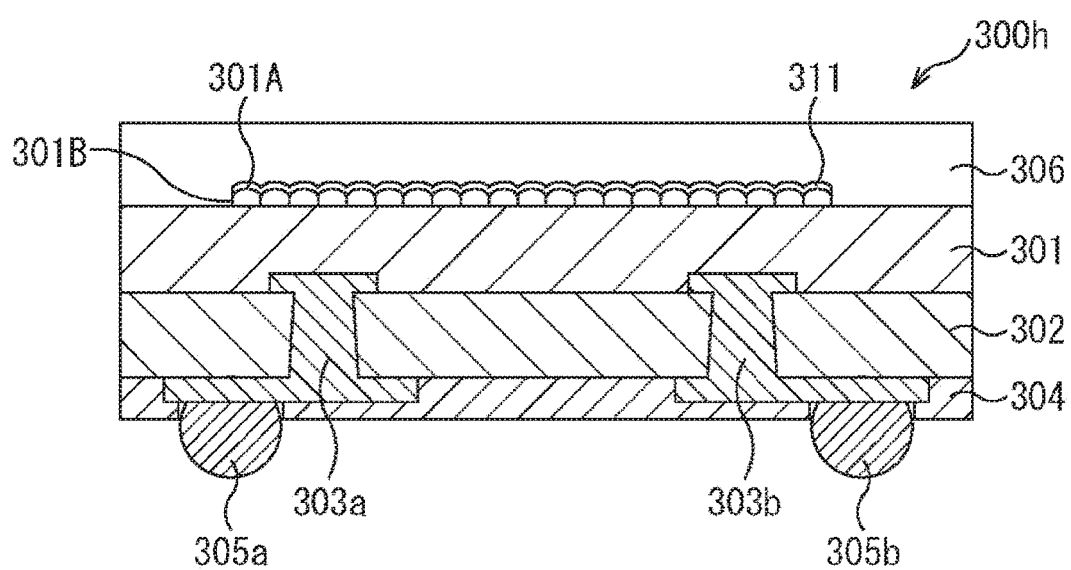
FIG. 22 is a cross-sectional view schematically illustrating a seventh modification of the semiconductor chip of FIG. 10.

FIG. 22 is a cross-sectional view schematically illustrating a configuration example of a semiconductor chip 300h that is a seventh modification of the semiconductor chip according to the second embodiment.

The semiconductor chip 300h differs from the semiconductor chip 300a of FIG. 10 in that a low refractive film 311 is formed on the on-chip lens 301A.

The low refractive film 311 includes a transparent resin film having a smaller refractive index than the on-chip lens 301A. The low refractive film 311 has a function to condense incident light on each microlens of the on-chip lens 301A, and as a result, sensitivity of the image sensor 301 is improved.

Figure 12:
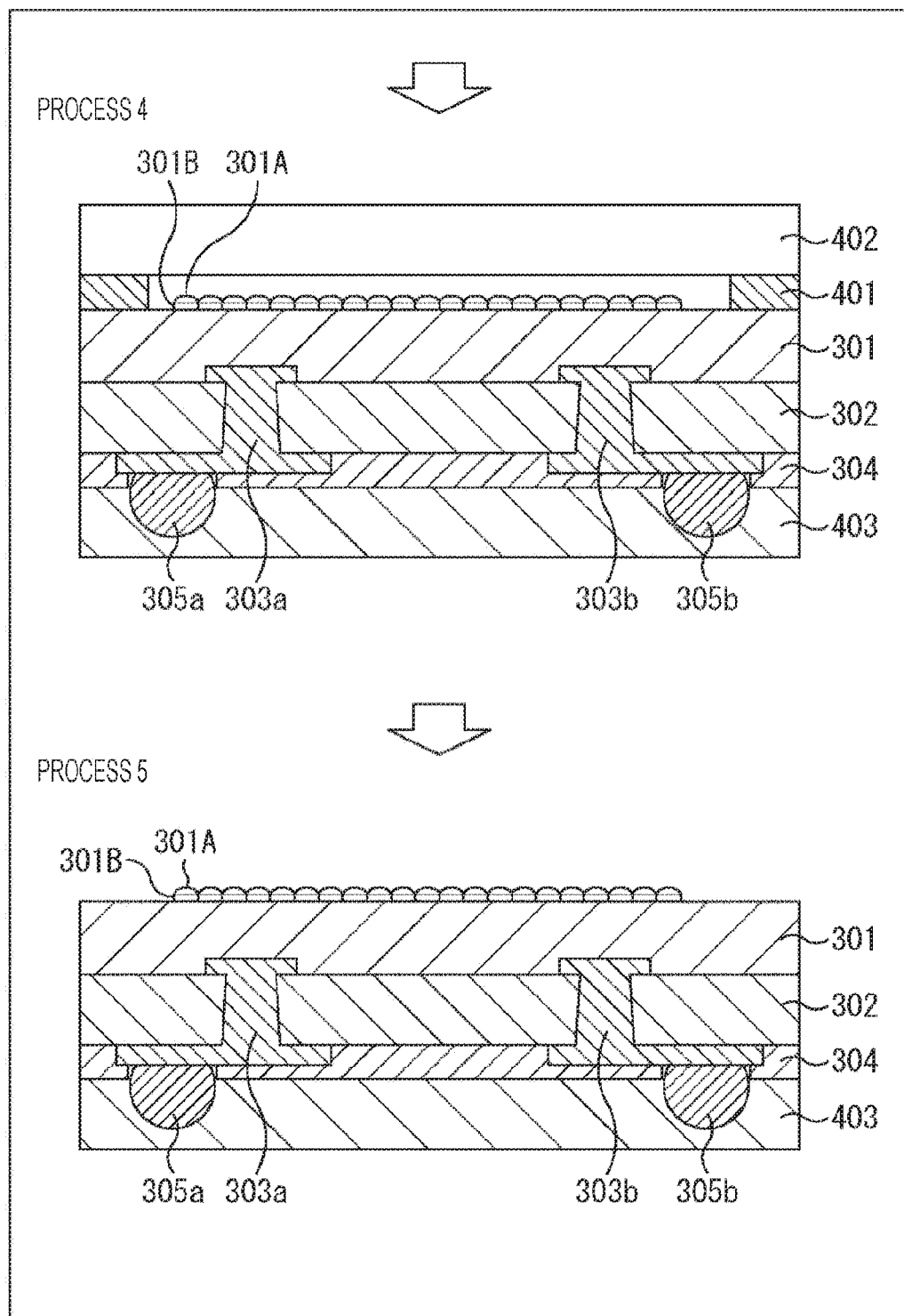
FIG. 12 is a diagram for describing the method of manufacturing the semiconductor chip of FIG. 10.

For example, the low refractive film 311 is formed before the transparent resin film 306 is formed between process 5 of FIG. 12 and process 6 of FIG. 13.

Other Modifications

The embodiment and the modifications described above can be combined within a possible range.

For example, in the semiconductor chip 300g, it is possible to use the antireflection film 308 of the semiconductor chip 300c instead of the antireflection film 309, or to omit the antireflection film.

In addition, for example, in the semiconductor chips 300b to 300g, the low refractive film 311 of the semiconductor chip 300h may be provided.

5. Application Examples

{Applications to Electronic Apparatus}

Note that, the semiconductor chip of each of the above-described embodiments can be applied to various electronic apparatuses such as an imaging system such as a digital still camera or a digital video camera, a mobile phone having an imaging function, or another device having an imaging function, for example.

Figure 23:
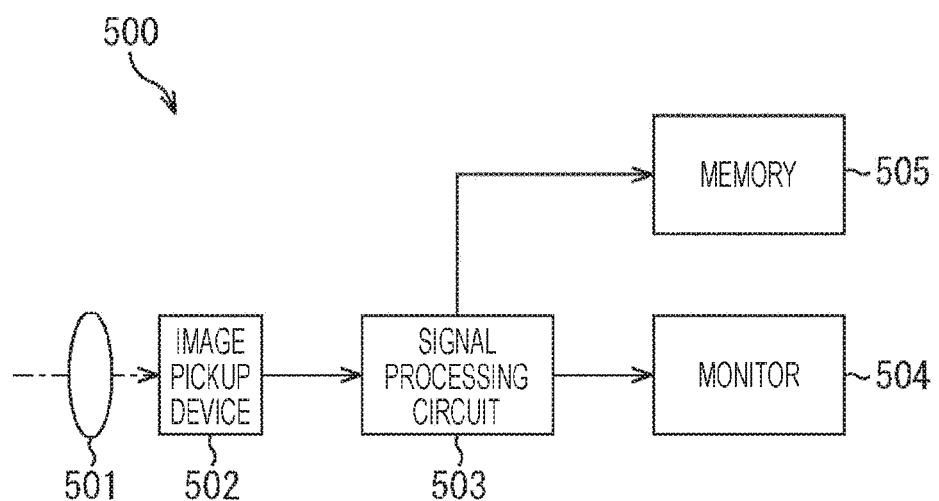
FIG. 23 is a block diagram illustrating a configuration example of an embodiment of an imaging apparatus to which the present technology is applied.

FIG. 23 is a block diagram illustrating a configuration example of an imaging apparatus mounted on an electronic apparatus.

As illustrated in FIG. 23, an imaging apparatus 500 includes an optical system 501, an image pickup device 502, a signal processing circuit 503, a monitor 504, and a memory 505, and can capture still images and video images.

The optical system 501 includes one or a plurality of lenses, and guides image light (incident light) from a subject to the image pickup device 502 to form an image on the light-receiving surface (sensor portion) of the image pickup device 502.

As the image pickup device 502, the semiconductor chip of each of the embodiments described above is applied. Electrons are accumulated in the image pickup device 502 for a certain period in accordance with the image formed on the light-receiving surface via the optical system 501. Then, a signal corresponding to the electrons accumulated in the image pickup device 502 is supplied to the signal processing circuit 503.

The signal processing circuit 503 performs various types of signal processing on the signal output from the image pickup device 502. An image (image data) obtained by performing signal processing by the signal processing circuit 503 is supplied to the monitor 504 to be displayed, or supplied to the memory 505 to be stored (recorded).

In the imaging apparatus 500 configured as described above, the semiconductor chip of each of the above-described embodiments is applied, whereby the image quality and reliability of the imaging apparatus 500 can be improved, or the imaging apparatus 500 can be downsized.

{Usage Examples of Image Sensor}

Figure 24:
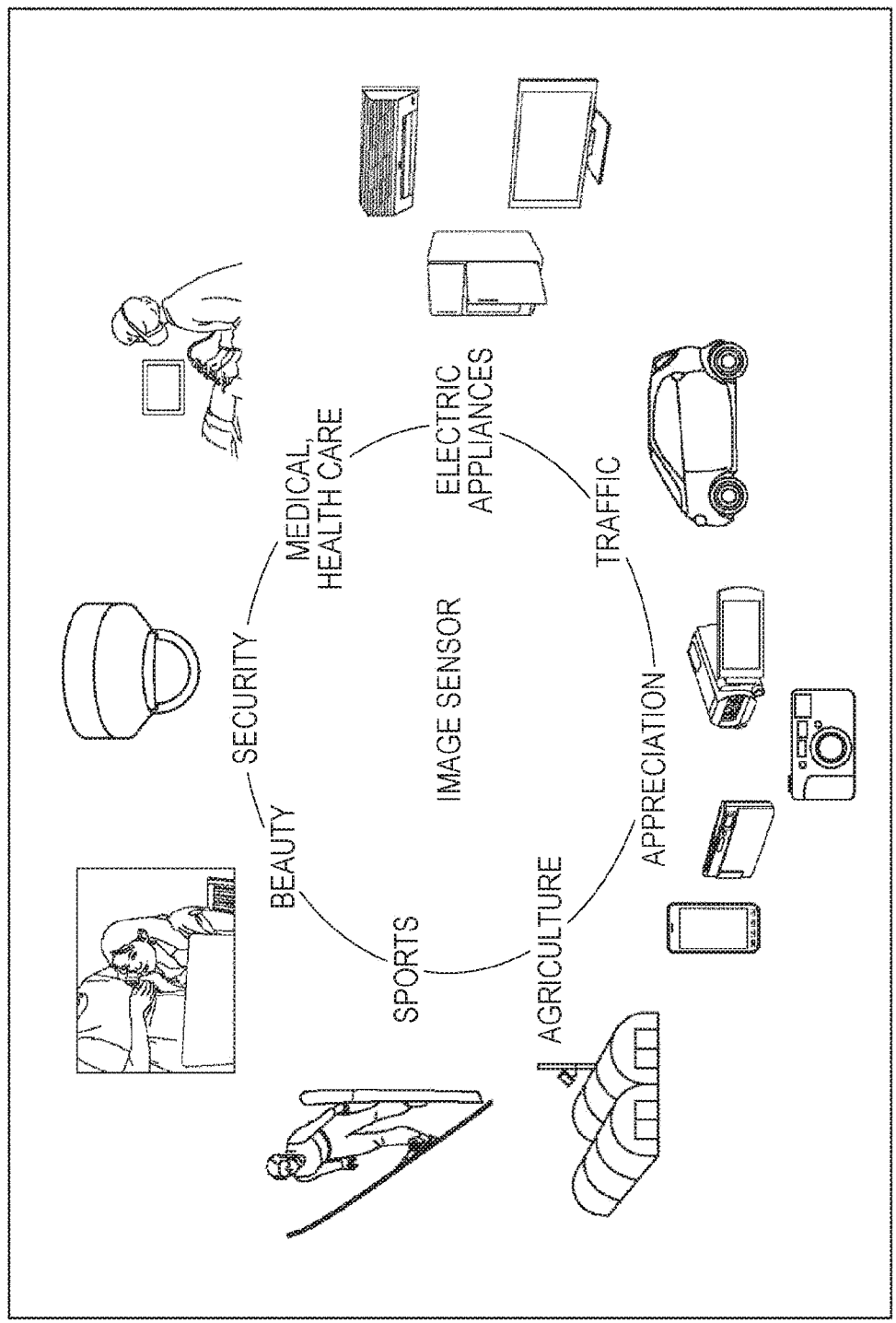
FIG. 24 is a diagram illustrating usage examples of an image sensor.

FIG. 24 is a diagram illustrating usage examples using an image sensor mounted on the above-described semiconductor chip.

The above-described image sensor can be used for various cases of sensing light such as visible light, infrared light, ultraviolet light, or X-rays, for example, as follows.

- An apparatus that photographs an image to be used for appreciation, such as a digital camera or a portable device with a camera function
- An apparatus to be used for traffic, such as an automotive sensor for photographing ahead of, behind, around, inside a car, and the like, a monitoring camera for monitoring traveling vehicles and roads, and a distance sensor for measuring a distance between vehicles and the like, for safe driving such as automatic stop, recognition of driver's condition, and the like
- An apparatus to be used for electric appliances, such as a TV, a refrigerator, and an air conditioner to photograph user's gesture and operate the appliances according to the gesture
- An apparatus to be used for medical care and healthcare, such as an endoscope or an apparatus for angiography by receiving infrared light
- An apparatus to be used for security, such as a monitoring camera for crime prevention applications, or a camera for person authentication applications
- An apparatus to be used for beauty, such as a skin measuring instrument for photographing skin, and a microscope for photographing a scalp
- An apparatus to be used for sports, such as a wearable camera or an action camera for sports applications or the like
- An apparatus to be used for agriculture, such as a camera for monitoring conditions of fields and crops Note that, in the specification, a system means an aggregation of a plurality of constituents (apparatus, module (component), and the like), and it does not matter whether or not all of the constituents are in the same cabinet. Therefore, a plurality of apparatuses that is accommodated in a separate cabinet and connected to each other via a network and one apparatus that accommodates a plurality of modules in one cabinet are both systems.

In addition, the embodiment of the present technology is not limited to the embodiments described above, and various modifications are possible without departing from the scope of the present technology.

Further, the advantageous effects described in the specification are merely examples, and the advantageous effects of the present technology are not limited to them and may include other effects.

In addition, for example, the present technology can also adopt the following configuration.

(1)

A semiconductor chip including:

an image pickup device;

a transparent protective member that protects the image pickup device;

an IR cut film arranged between a light-receiving surface of the image pickup device and the protective member;

a bonding layer that bonds the IR cut film and the protective member together; and a protective film that covers side surfaces of the IR cut film and the bonding layer.

(2)

The semiconductor chip according to (1), in which the protective film further covers at least a portion of a side surface of the image pickup device.

(3)

The semiconductor chip according to (1) or (2), in which the IR cut film and the bonding layer each include an adhesive type IR cut film having adhesiveness, and the image pickup device and the protective member are bonded together via the adhesive type IR cut film.

(4)

The semiconductor chip according to (1) or (2), in which in the IR cut film, a plurality of films having respective different light-shielding wavelength bands is layered.

(5)

The semiconductor chip according to any of (1) to (4), in which metal solder having a melting point of less than or equal to 150° C. is provided on a surface to be soldered of the semiconductor chip.

(6)

The semiconductor chip according to any of (1) to (5), in which a reflective type IR cut film is formed on at least one surface of the protective member.

(7)
The semiconductor chip according to any of (1) to (6), in which
the IR cut film is a coating type.

(8)
An electronic apparatus including:
a semiconductor chip including
an image pickup device,
a transparent protective member that protects the image pickup device,
an IR cut film arranged between a light-receiving surface of the image pickup device and the protective member;
a bonding layer that bonds the IR cut film and the protective member together, and
a protective film that covers side surfaces of the IR cut film and the bonding layer; and
a signal processing circuit that processes a signal from the image pickup device.

(9)
A semiconductor chip including:
an image pickup device;
a transparent protective member that protects the image pickup device; and
an IR cut film arranged inside the protective member.

(10)
The semiconductor chip according to (9), in which
the protective member includes:
a first member including a planar groove in which the IR cut film is arranged, on a surface on an opposite side of the image pickup device from a light-receiving surface side; and
a second member that seals the groove, and
a bonding layer that bonds the IR cut film and the second member together is further included.

(11)
An electronic apparatus including:
a semiconductor chip including
an image pickup device,
a transparent protective member that protects the image pickup device, and
an IR cut film arranged inside the protective member; and
a signal processing circuit that processes a signal from the image pickup device.

(12)
A semiconductor chip including:
an image pickup device, and
a transparent resin film that is applied on a light-receiving surface side of the image pickup device and protects the image pickup device.

(13)
The semiconductor chip according to (12), in which a thickness of the resin film is less than 200 µm.

(14)
The semiconductor chip according to (12) or (13), in which
an IR cut film is arranged on the resin film.

(15)
The semiconductor chip according to (14), in which
an antireflection film is arranged on the IR cut film.

(16)
The semiconductor chip according to (15), in which
the antireflection film further surrounds side surfaces of the resin film and the IR cut film.

(17)
The semiconductor chip according to any of (12) to (16), in which a diffraction grating is formed on a surface of the resin film.

(18)
The semiconductor chip according to (17), in which
the diffraction grating includes a slit-shaped light-shielding film.

(19)
The semiconductor chip according to any of (12) to (18), in which
a transparent film is arranged on an on-chip lens of the image pickup device, the transparent film having a refractive index smaller than a material of the on-chip lens.

(20)
An electronic apparatus including:
a semiconductor chip including
an image pickup device and
a transparent resin film that is applied on a light-receiving surface side of the image pickup device and protects the image pickup device; and
a signal processing circuit that processes a signal from the image pickup device.

REFERENCE SIGNS LIST 10a to 10g Semiconductor chip
11 Image sensor
12 IR cut film
13 Bonding layer
14 Glass
15 Protective film
16 Solder ball
51 Short IR cut film
52 Long IR cut film
61 Solder ball
101, 102 Reflective type IR cut film
121 Adhesive type IR cut film
141 Image sensor
142 Protective film
202 Protective member
202a, 202b Glass
203 IR cut film
204 Bonding layer
300a to 300h Semiconductor chip
301 Image sensor
301A On-chip lens
301B Color filter
306 Transparent resin film
307 IR cut film
308, 309 Antireflection film
310 Light-shielding film
401 Temporary bonding resin
402 Glass substrate
403 Laminate tape
500 Imaging apparatus
502 Image pickup device
503 Signal processing circuit

The invention claimed is:
1. A semiconductor chip, comprising:
an image pickup device;
a transparent protective member that protects the image pickup device;
an infrared (IR) cut film between a light-receiving surface of the image pickup device and the transparent protective member, wherein an edge of the IR cut film is coincident with an outer edge of the image pickup device;

a bonding layer that bonds the IR cut film with the transparent protective member;
a protective film that covers a side surface of the IR cut film, a side surface of the bonding layer, and at least a portion of a side surface of the image pickup device, wherein the protective film is different from the bonding layer; and
a metal solder on a specific surface of the semiconductor chip, wherein melting point of the metal solder is less than or equal to 150° C.

2. The semiconductor chip according to claim 1, further comprises an adhesive type IR cut film having adhesiveness, wherein the adhesive type IR cut film bonds the image pickup device with the transparent protective member.

3. The semiconductor chip according to claim 1, wherein the IR cut film comprises a plurality of films, and
each film of the plurality of films is associated with a different light-shielding wavelength band.

4. The semiconductor chip according to claim 1, wherein the specific surface is opposite to the light-receiving surface.

5. The semiconductor chip according to claim 1, wherein a reflective type IR cut film is on at least one surface of the transparent protective member.

6. The semiconductor chip according to claim 1, wherein the IR cut film is a coating type IR cut filter.

7. The semiconductor chip according to claim 1, wherein a material of the protective film is different from a material of the bonding layer.

8. The semiconductor chip according to claim 7, wherein the material of the bonding layer is a transparent sealing resin, and
the material of the protective film is one of Silicon Nitride (SiN), Silicon Oxynitride (SiON), Aluminium, or Titanium.

9. The semiconductor chip according to claim 1, wherein a material of the metal solder is one of SnBi, SnBiAg, SnIn, or In.

10. An electronic apparatus, comprising:
a semiconductor chip including:
an image pickup device;
a transparent protective member that protects the image pickup device;
an infrared (IR) cut film between a light-receiving surface of the image pickup device and the transparent protective member, wherein an edge of the IR cut film is coincident with an outer edge of the image pickup device;
a bonding layer that bonds the IR cut film with the transparent protective member; and
a protective film that covers a side surface of the IR cut film, a side surface of the bonding layer, and at least a portion of a side surface of the image pickup device, wherein the protective film is different from the bonding layer;
a metal solder on a specific surface of the semiconductor chip, wherein melting point of the metal solder is less than or equal to 150° C.; and
a signal processing circuit configured to process a signal from the image pickup device.

11. A semiconductor chip, comprising:
an image pickup device;
a transparent protective member that protects the image pickup device, wherein the transparent protective member includes:
a first member that includes a planar groove inside the first member,
a second member that seals the planar groove,
a first bonding layer that bonds an infrared (IR) cut film with the second member, and
the IR cut film that is inside the transparent protective member; and
a second bonding layer that bonds the first member with the image pickup device, wherein the second bonding layer is different from the first bonding layer.

12. The semiconductor chip according to claim 11, wherein
the IR cut film is inside the planar groove.

13. An electronic apparatus, comprising:
a semiconductor chip including:
an image pickup device;
a transparent protective member that protects the image pickup device, wherein the transparent protective member includes:
a first member that includes a planar groove inside the first member,
a second member that seals the planar groove,
a first bonding layer that bonds an infrared (IR) cut film with the second member, and
the IR cut film that is inside the transparent protective member; and
a second bonding layer that bonds the first member with the image pickup device, wherein the second bonding layer is different from the first bonding layer; and
a signal processing circuit configured to process a signal from the image pickup device.

* * * * *